United States Patent
Aoyagi et al.

(10) Patent No.: US 7,277,465 B2
(45) Date of Patent: Oct. 2, 2007

(54) SEMICONDUCTOR LASER

(75) Inventors: Toshitaka Aoyagi, Tokyo (JP); Satoshi Shirai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 171 days.

(21) Appl. No.: 10/642,611

(22) Filed: Aug. 19, 2003

(65) Prior Publication Data

US 2004/0057484 A1 Mar. 25, 2004

(30) Foreign Application Priority Data

Sep. 19, 2002 (JP) .............................. 2002-273174

(51) Int. Cl.
*H01S 3/08* (2006.01)
(52) U.S. Cl. .................... 372/96; 372/45.01
(58) Field of Classification Search ............. 372/96, 372/45.01
See application file for complete search history.

(56) References Cited

U.S. PATENT DOCUMENTS

| | | | | |
|---|---|---|---|---|
| 5,020,072 A | * | 5/1991 | Abe et al. ................... | 372/96 |
| 5,379,318 A | * | 1/1995 | Weber ........................ | 372/96 |
| 5,386,433 A | * | 1/1995 | Ohkura et al. ............. | 372/96 |
| 5,459,747 A | * | 10/1995 | Takiguchi et al. ......... | 372/50.11 |
| 5,617,436 A | * | 4/1997 | Lo ............................. | 372/45 |
| 5,727,015 A | * | 3/1998 | Takahashi et al. ......... | 372/96 |
| 6,175,581 B1 | * | 1/2001 | Sato .......................... | 372/50.11 |
| 6,574,261 B2 | * | 6/2003 | Huang ...................... | 372/96 |

FOREIGN PATENT DOCUMENTS

| | | |
|---|---|---|
| DE | 4322163 | 1/1995 |
| DE | 4334525 | 4/1995 |
| DE | 10200360 | 7/2003 |
| JP | 10-223967 | 8/1998 |

OTHER PUBLICATIONS

"High Power and High Speed Performance of 1.3 µm Strained MQW Gain Coupled DFB Lasers," IEEE JQE, vol. 1, No. 2 1995, pp. 375-381.*
"Abstract of High Efficiency Active Distributed-Reflector Laser of Asymmetric Structure", *IEICE conference*, 1984, 2(2).

* cited by examiner

*Primary Examiner*—Minsun Oh Harvey
*Assistant Examiner*—Tod T. Van Roy
(74) *Attorney, Agent, or Firm*—Leydig, Voit & Mayer, Ltd.

(57) ABSTRACT

In a refractive index coupling distributed semiconductor laser having a Λ/2-phase-shift distributed feedback structure with a diffraction grating having a refractive index coupling property on an active layer, when viewed in a light distributed feedback direction, a value of (duty of a high refractive index portion)/(duty of a low refractive index portion) of a diffraction grating in a rear end face region is larger than that of a diffraction grating in a front end face region. In this manner, a coupling coefficient κ2 in a front end face region of a conventional semiconductor laser is smaller than a coupling coefficient κ1 in a rear end face region and is larger than 100 cm$^{-1}$.

8 Claims, 4 Drawing Sheets

SEMICONDUCTOR LASER

BACKGROUND OF THE INVENTION

1. Field of the Invention

The present invention relates to a distributed feedback semiconductor laser used in optical communication.

2. Description of the Background Art

In a conventional phase-shift distributed feedback semiconductor laser for optical fiber communication, when the cycle of a diffraction grating is represented by $\Lambda$, single-axial mode oscillation has been realized by a $\Lambda/2$-phase-shift structure or the like. However, in this structure, the intensities of laser beams output from the front and rear end faces are almost equal to each other. For this reason, in order to obtain a large optical output from the front end face, a large drive current must be applied to the semiconductor laser.

In order to solve the problem, an asymmetrical structure may be given to the diffraction grating to achieve an efficient activity distributed reflective laser (for example, see reference 1).

This attempts to achieve high efficiency such that a $\Lambda/2$-phase-shift structure or the like is arranged between a region on the rear end face side and a region on the front end face side to obtain a single-axial mode. It is assumed that a coupling coefficient of a diffraction grating in the rear end face region is represented by $\kappa1$ and that a coupling coefficient of a diffraction grating in the front end face region is represented by $\kappa2$. In this case, the diffraction grating in the front end face region has a corrugation which is shallower than that of the diffraction grating in the rear end face region. For this reason, an optical output P2 from the front end face of the front end face region is larger than an optical output P1 from the rear end face in the rear end face region. This is because a ratio (A2/A1) of a power A2 of a lightwave emitted from a phase-shift region to the front end face to a power A1 of a lightwave emitted to the rear end face increases depending on the depth of the asymmetrical corrugation. When a concrete parameter such as a dimension is given to the laser, a large optical output ratio (P2/P1) of 1 to 16 or 1 to 27 can be obtained.

However, in the laser described above, as the ratio of $\kappa1/\kappa2$ is increased to increase the optical output ratio (P2/P1) of the front end face and the rear end face, a threshold gain difference $\Delta$gth between a main axial mode and a sub-axial mode becomes small. In high-speed modulation, oscillation is easily made in the sub-axial mode disadvantageously.

In the distributed feedback semiconductor laser, in order to improve the linearity of an optical output/current characteristic, the coupling coefficient is changed in the direction of resonator length (for example, see reference 2).

This Reference 2 aims at improving the linearity of an optical output/current characteristic. Therefore the coupling coefficient is changed in the direction of resonator length. But the concrete value over coupling coefficient is not described.

[Reference 1]

Eda et al., IEICE electric wave section meeting lecture letters in October 1984, No. 271 in the second separate volume

[Reference 2]

Japanese Patent Application Laid-Open No. 10-223967 (1998)

SUMMARY OF THE INVENTION

The present invention provides a distributed feedback semiconductor laser which can achieve high efficiency without deteriorating the stability of an axial mode.

The present invention is applied to a refractive index coupling distributed semiconductor laser having a $\Lambda/2$-phase-shift distributed feedback structure with a refractive index coupling diffraction grating formed on an active layer. When the semiconductor laser is viewed in a light distributed feedback direction, the value of (duty of high refractive index portion)/(duty of low refractive index portion) of a diffraction grating in a rear end face region is set to be larger than that of a diffraction grating in the front end face region. In this manner, an average coupling coefficient $\kappa2$ of the diffraction grating in the front end face region is set to be smaller than an average coupling coefficient $\kappa1$ of the diffraction grating in the rear end face region, and the coupling coefficient $\kappa2$ is set to be larger than 100 cm$^{-1}$.

DETAILED DESCRIPTION OF PREFERRED EMBODIMENTS

First Embodiment

Figure 1:
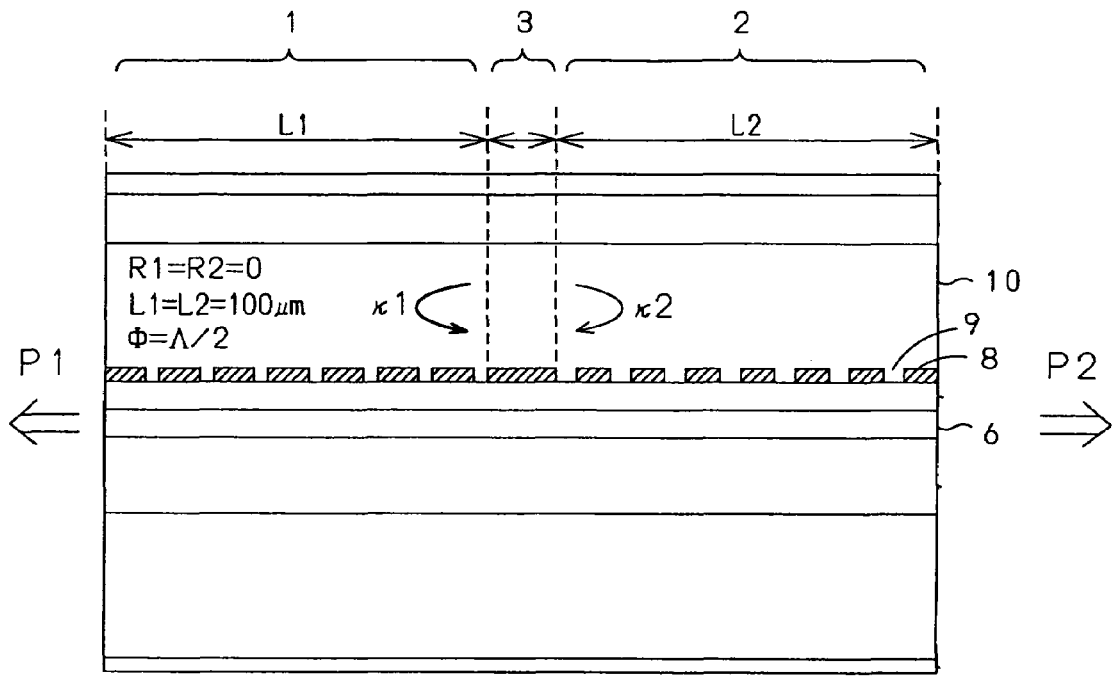
FIG. 1 is a sectional view of a semiconductor laser according to the first embodiment of the present invention.

FIG. 1 is a sectional view of a semiconductor laser showing the first embodiment of the present invention. This semiconductor laser has a $\Lambda/2$-phase-shift distributed feedback structure having refractive index coupling diffraction gratings 8 and 9 formed on an active layer 6. With respect to a Bragg wavelength $\Lambda g$, when a phase shifts lambda/2 by passing phase shift structure 3, the phase of reflection of a lightwave which advances to the right of a rear end face region 1 is equal to the phase of reflection of a lightwave in which advances to the left of a front end face region 2. For this reason, strong resonance (oscillation) having a wavelength of $\Lambda g$ is produced.

In FIG. 1, when viewed in a light distributed feedback direction, a value of (duty of a high refractive index portion 8)/(duty of a low refractive index portion 9) in a diffraction grating in the rear end face region 1 is set to be larger than the value in the front end face region 2, so that the coupling coefficient $\kappa1$ in the rear end face region 1 is set to be larger than the coupling coefficient $\kappa2$ which is almost equal to the value of a front end face region 2 in a general distributed feedback semiconductor laser. Here, the coupling coefficient $\kappa1$ and $\kappa2$ are both absolute values. In this case, the "coupling" means coupling between a forward wave and a backward wave. The low refractive index portion 9 is substantially the same as an n-InP second clad layer 10.

With this configuration, an amount of feedback of light to an element center in the forward direction of the light is larger in the rear end face region 1 than in the front end face region 2. As a result, a large optical output is obtained from the end face in the front end face region 2.

Figure 2:
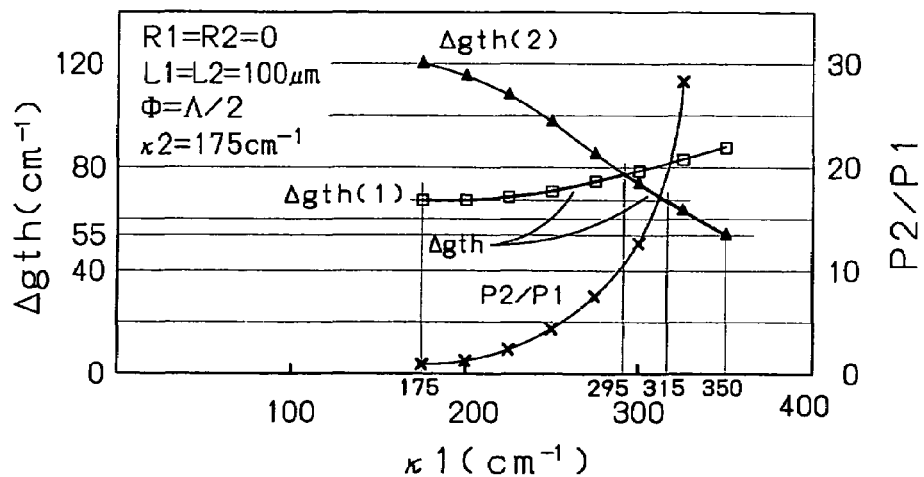
FIG. 2 is a graph showing a threshold gain difference and optical outputs with respect to a change in coupling coefficient.

As shown in FIG. 2, as concrete parameters, a length L1 of the rear end face region 1 and a length L2 of the front end face region 2 are set to be 100 μm each, reflectances R1 and R2 of the front end face and the rear end face are set to be zero each, and the coupling coefficient κ2 of the front end face region 2 are set to be 175 cm$^{-1}$. In this case, when the coupling coefficient κ1 of the rear end face region 1 is increased from 175 cm$^{-1}$ to 325 cm$^{-1}$, the ratio (P2/P1) of optical outputs from the front end face and the rear end face increases from one time to 28 times.

The threshold gain difference Δgth is the gain difference between a main axial mode and a sub-axial mode. Therefore as shown in FIG. 2, when the coupling coefficient κ1 is less than 295 cm$^{-1}$, the threshold gain difference Δgth is Δgth(1), and when the coupling coefficient κ1 is less than 295 cm$^{-1}$ or more, said threshold gain difference Δgth is Δgth(2). Although this threshold gain difference Δgth obtained when the coupling coefficient κ1 is above 295 cm$^{-1}$ decreases, even when the coupling coefficient κ1 is 315 cm$^{-1}$, said threshold gain difference Δgth is larger than that obtained when the coupling coefficient κ1 is 175 cm$^{-1}$. Thus, when the coupling coefficient κ1 ranges from 175$^{-1}$ cm to 315 cm$^{-1}$, with an increase in the optical output ratio P2/P1, threshold gain difference Δgth does not fall greatly. This shows that axial mode is stable and with respect to this point, This semiconductor differs from a conventional semiconductor laser.

The threshold gain difference Δgth obtained when the coupling coefficient κ1 exceeds 315 cm$^{-1}$ is smaller than that obtained when the coupling coefficient κ1 is equal to 175 cm$^{-1}$ (the value of the coupling coefficient κ2). However, even though the coupling coefficient κ1 is 350 cm$^{-1}$, as the threshold gain difference, a value of 55 cm$^{-1}$ or more is still obtained, that exhibits preferable single mode property.

In this embodiment, the both the lengths L1 and L2 of the rear end face region 1 and the front end face region 2 are set to be 100 μm each. However, another combination of lengths may be used unless the single-axial mode property is not deteriorated. For descriptive convenience, the reflectances R1 and R2 of the front end face and the rear end face are set to be zero each. However, a front end face and a rear end face which have such reflectances that the single-axial mode property is not deteriorated are effected in the present invention.

Furthermore, in this embodiment, the coupling coefficient κ2 is set to be 175 cm$^{-1}$, and the coupling coefficient κ1 is set to be 175 cm$^{-1}$ to 350 cm$^{-1}$. However, even though the coupling coefficient κ2 exceeds a coupling coefficient, i.e., 100 cm$^{-1}$, of a general distributed feedback semiconductor laser, the same effect as described above can be obtained. In this embodiment, the diffraction gratings 8 and 9 are arranged on the active layer 6. However, the present invention can also be applied to a structure in which diffraction gratings are formed under an active layer.

For example, this invention is applicable to LD of a wavelength the belt of 1.2–1.6 micrometers, LD which has an InGaAsP activity layer, and LD which has an AlGaInAs activity layer.

Second Embodiment

The first embodiment describes that a diffraction grating has a refractive index coupling property. However, a complex coupling diffraction grating using a diffraction grating having a gain coupling property which does not deteriorate a single-axial mode property, for example, a diffraction grating in which the absolute value of the real part of a coupling coefficient is four or more times the absolute value of the imaginary part may be used.

Third Embodiment

Figure 3:
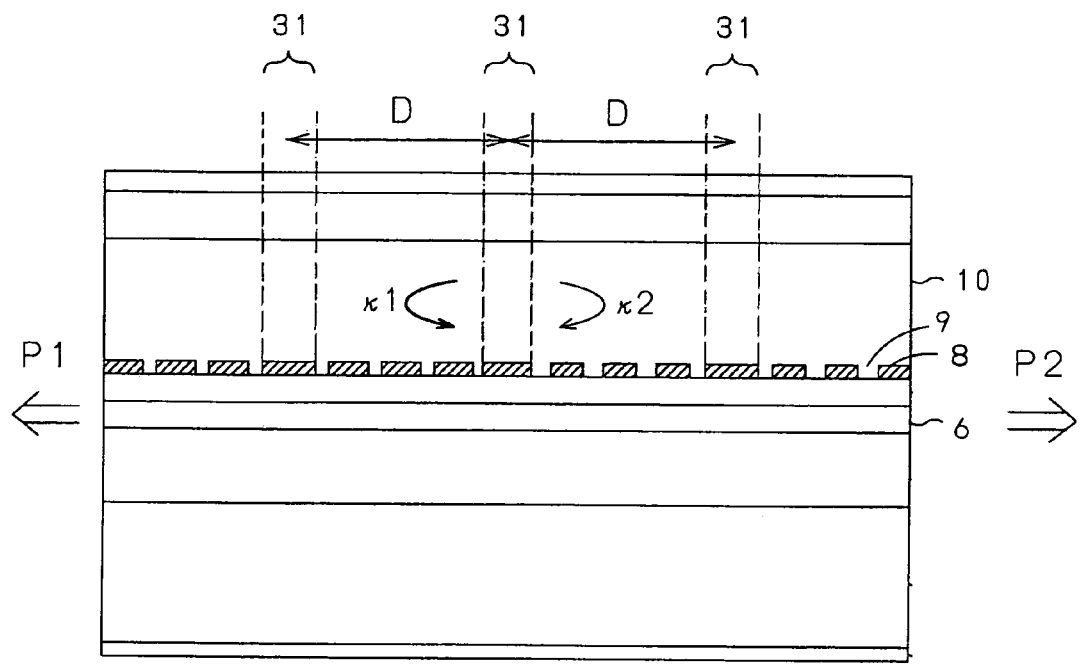
FIG. 3 is a sectional view of a semiconductor laser according to the third embodiment of the present invention.

In the first embodiment, one phase-shift structure 3 is formed at an almost central portion in a light distributed feedback direction in a region in which a diffraction grating is formed. However, as shown in FIG. 3, the present invention can also be applied to a structure in which a plurality of phase-shift structures 31 are formed at almost symmetrical positions about a central portion in a light distributed feedback direction in a region in which a diffraction grating is formed.

Fourth Embodiment

Figure 4:
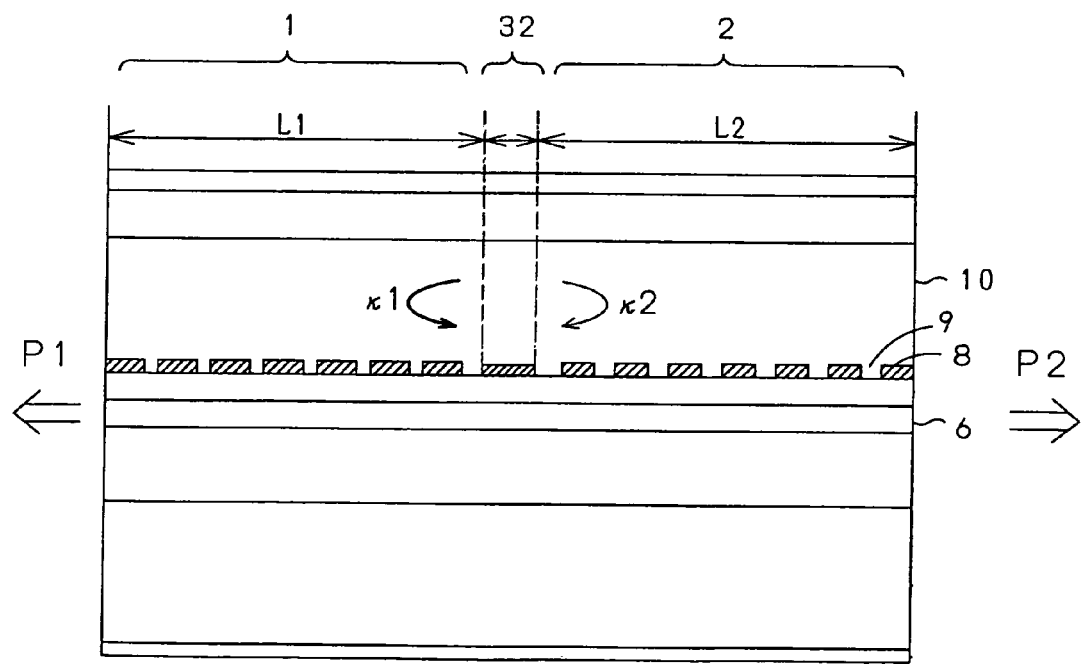
FIG. 4 is a sectional view of a semiconductor laser according to the fourth embodiment of the present invention.
Figure 5:
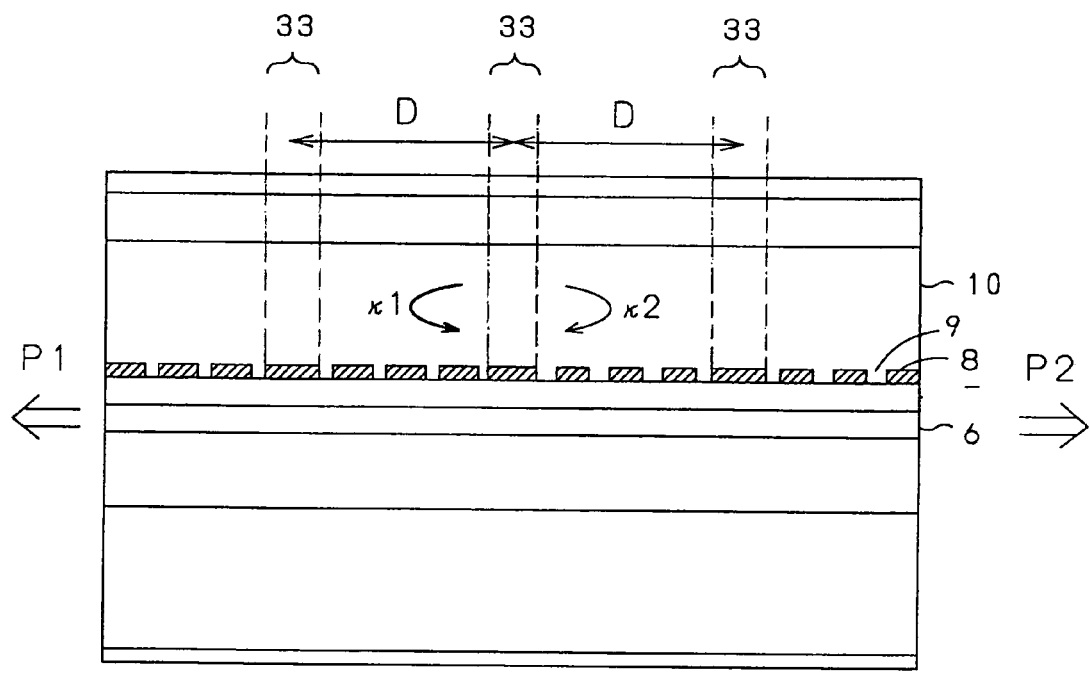
FIG. 5 is a sectional view of a semiconductor laser according to the fourth embodiment of the present invention.

In the first embodiment, one phase-shift structure 3 is used, and a phase-shift amount of the phase-shift structure 3 is Λ/2. However, as shown in FIG. 4, when one phase-shift structure 32 is used, even though a phase-shift amount of the phase-shift structure is not Λ/2, the present invention can be applied unless the single-axial mode is not deteriorated. As shown in FIG. 5, a plurality of phase-shift structures 33 are arranged. Even though the sum of phase-shift amounts given by all the phase-shift structures 33 is not Λ/2, the present invention can be applied unless the single-axial mode property is deteriorated.

Fifth Embodiment

Figure 6:
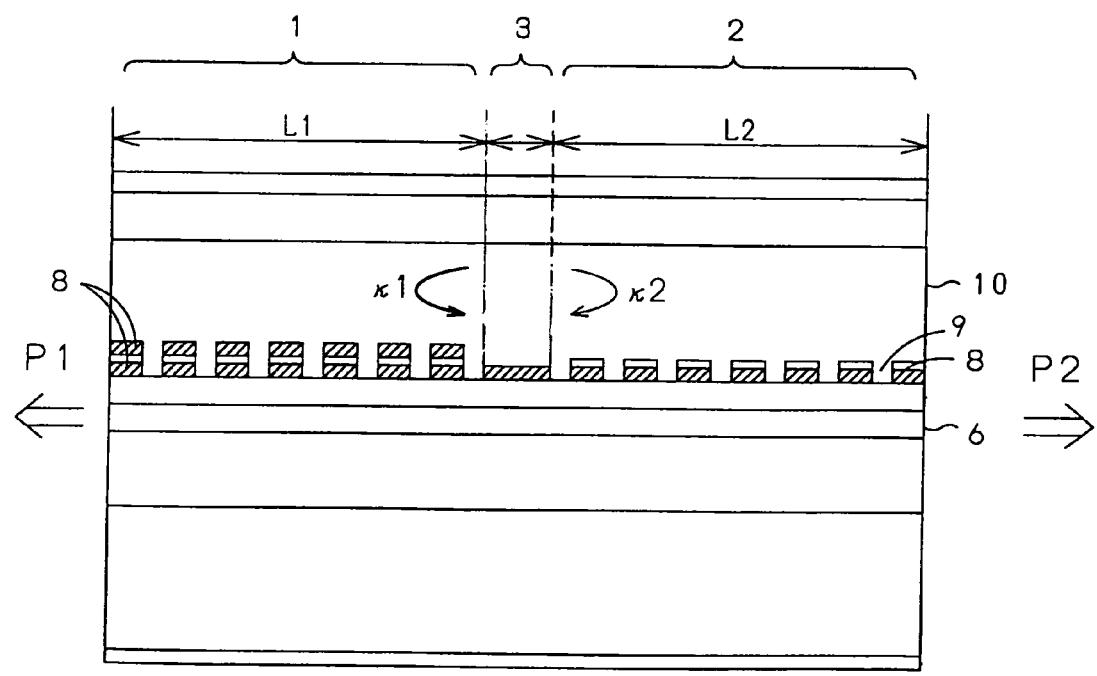
FIG. 6 is a sectional view of a semiconductor laser according to the fifth embodiment of the present invention.

In the first embodiment, when viewed in a light distributed feedback direction, a value of (duty of a high refractive index portion 8)/(duty of a low refractive index portion 9) in the diffraction grating in the rear end face region 1 is set to be larger than the value in the diffraction grating in the front end face region 2, so that a coupling coefficient κ1 which is larger than the coupling coefficient κ2 which is almost equal to the value of a front end face region 2 in a general distributed feedback semiconductor laser is given to the rear end face region 1. However, as shown in FIG. 6, when the number of layers (two layers in FIG. 6) of the high refractive index portion 8 in the diffraction grating in the rear end face region 1 is set to be larger than the number of layers (one layer in FIG. 6) of the low refractive index portion 9 in the diffraction grating in the front end face region 2, the present invention can be applied. Therefore, in FIG. 6, the value of (duty of the high refractive index portion 8)/(duty of the low refractive index portion 9) in the rear end face region 1 is equal to that in the front end face region 2.

Sixth Embodiment

Figure 7:
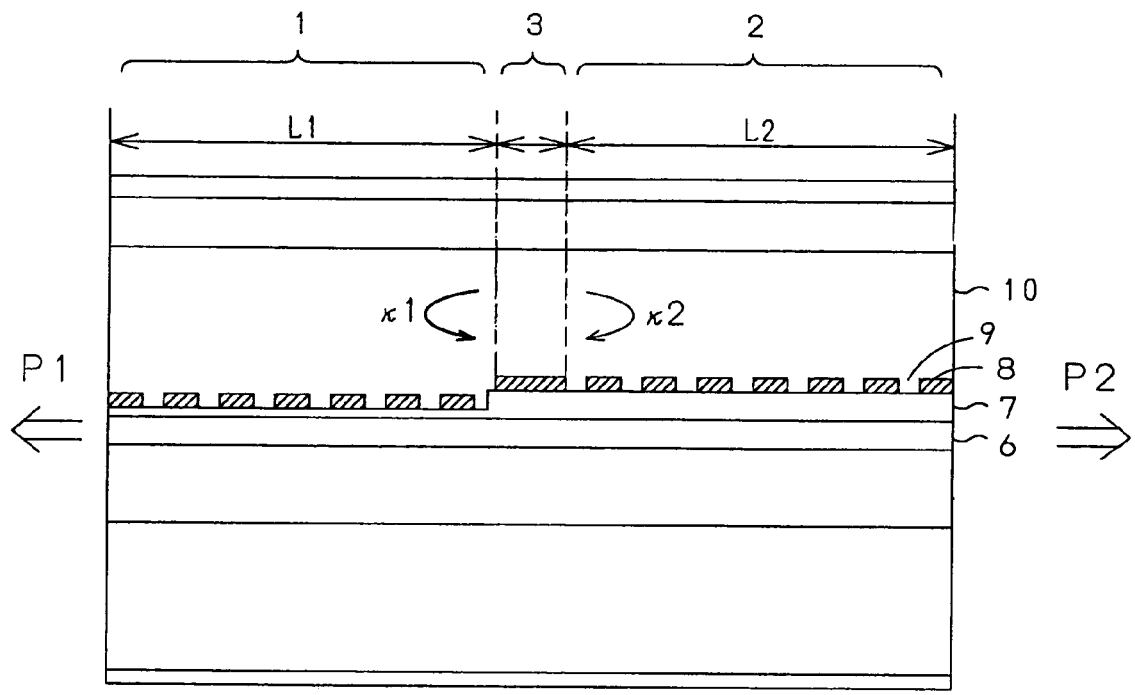
FIG. 7 is a sectional view of a semiconductor laser according to the sixth embodiment of the present invention.

In FIG. 7, the thickness of a low refractive index layer 7 existing between the layer of a high refractive index portion 8 of a diffraction grating and an active layer 6 is set smaller in the rear end face region 1 than in the front end face region 2. Therefore, the same effects as in the fourth (FIGS. 4 and 5) and the fifth embodiment (FIG. 6) can be obtained.

Seventh Embodiment

Figure 8:
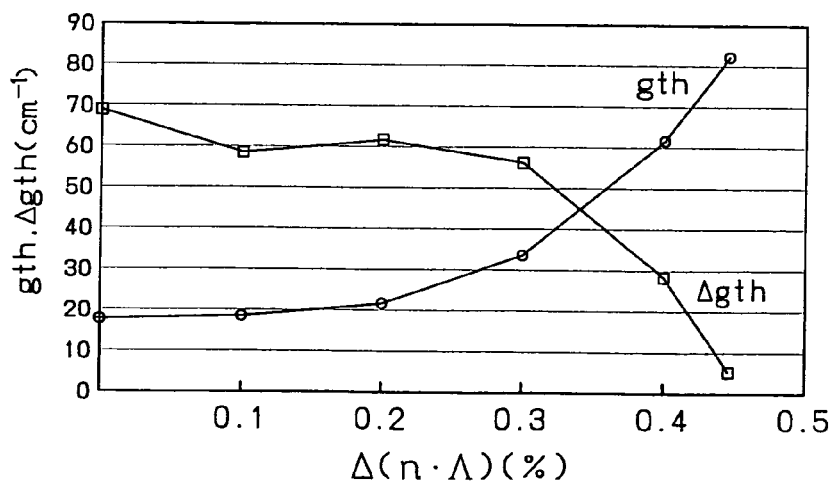
FIG. 8 is a graph showing changes in threshold gain and threshold gain difference depending on a change in equivalent refractive index.

In each of the first to sixth embodiments, optical outputs are made asymmetrical by using the structure in which a cycle Λ1 of the diffraction grating in the rear end face region 1 is equal to a cycle Λ2 of the diffraction grating in the front end face region 2 and κ2<κ1 is satisfied. However, in this case, when an equivalent refractive index acting when light is propagated through the front end face region 2 and an equivalent refractive index acting when light is propagated through the rear end face region 1 are represented by n2 and n1, respectively, a relationship n1>n2 is generated. As shown in FIG. 8, a single-axial mode property Δgth is deteriorated, and a threshold gain gth of a fundamental-width mode tends to increase. Therefore, the relationship between the coupling coefficient κ2 and the coupling coefficient κ1 are controlled such that n2·Λ2 is almost equal to n1·Λ1, so that a considerably preferable single-axial mode property and a small threshold value can be realized.

Eighth Embodiment

When the semiconductor lasers described in the first to seventh embodiments are integrated with other optical devices or electronic devices, the effect of the present invention can be obtained as a matter of course.

According to the present invention, the average coupling coefficient κ2 of the diffraction grating in one end face side is set to be smaller than the average coupling coefficient κ1 of the diffraction grating in the other end face side, and the coupling coefficient κ2 is set to be larger than 100 cm$^{-1}$. Therefore, high efficiency can be achieved without deteriorating the stability of axial modes.

What is claimed is:

1. A distributed feedback semiconductor laser comprising:
opposed first and second end surfaces through which light generated within the semiconductor laser is emitted;
a central phase-shift structure located substantially centrally between the first and second end surfaces; and
first and second complex coupled diffraction gratings respectively extending from the central phase-shift structure to the first and second end faces, wherein
an average coupling coefficient κ2 of the second complex coupled diffraction grating is smaller than an average coupling coefficient κ1 of the first complex coupled diffraction grating, and the coupling coefficient κ1 is within a range from 175 cm$^{-1}$ to 295 cm$^{-1}$, and
absolute value of a real part of a coupling coefficient is at least four times absolute value of an imaginary part of the coupling coefficient.

2. The distributed feedback semiconductor laser according to claim 1, including a plurality of phase-shift structures located at substantially symmetrical positions with respect to the central phase-shift structure and in the first and second complex coupled diffraction gratings.

3. The distributed feedback semiconductor laser according to claim 1, wherein each of the first and second complex coupled diffraction gratings includes alternating regions of higher and lower refractive index materials and the ratio of higher to lower refractive index materials is larger in a region having the coupling coefficient κ1 than in a region having the coupling coefficient κ2.

4. The distributed feedback semiconductor laser according to claim 1, wherein a layer supporting the first and second complex coupled diffraction gratings has a thickness smaller in a region having the coupling coefficient κ1 than in a region having the coupling coefficient κ2.

5. The distributed feedback semiconductor laser according to claim 1, wherein equivalent refractive index in a region having the coupling coefficient κ2 is n2, equivalent refractive index in a region having the coupling coefficient κ1 is n1, the period of the second complex coupled diffraction grating in the region having the coupling coefficient κ2 is Λ2, the period of the first complex coupled diffraction grating in the region having the coupling coefficient κ1 is Λ1, and n2·Λ2 is substantially equal to n1·Λ1.

6. The distributed feedback semiconductor laser according to claim 1, wherein the first and second complex coupled diffraction gratings have respective, different periods.

7. The distributed feedback semiconductor laser according to claim 1, wherein the coupling coefficient κ2 exceeds 100 cm$^{-1}$.

8. A distributed feedback semiconductor laser comprising:
opposed first and second end surfaces through which light generated within the semiconductor laser may be emitted;
a central phase-shift structure located substantially centrally between the first and second end surfaces; and
first and second diffraction gratings respectively extending from the central phase-shift structure to the first and second end faces and having respective, different periods, wherein an average coupling coefficient κ1 of the second diffraction grating is smaller than an average coupling coefficient κ1 of the first diffraction grating, and the coupling coefficient κ2 exceeds 100 cm$^{-1}$, wherein
each of the first and second diffraction gratings includes alternating regions of higher and lower refractive index materials,
the regions having a higher refractive index have a layered structure, and
the number of layers of the higher refractive index regions in the first diffraction grating and having the coupling coefficient κ1 is larger than the number of layers of the higher refractive index materials in the second diffraction grating having the coupling coefficient κ2.

* * * * *